(12) United States Patent
Nonaka et al.

(10) Patent No.: US 7,900,677 B2
(45) Date of Patent: Mar. 8, 2011

(54) SHEET STICKING APPARATUS

(75) Inventors: Hideaki Nonaka, Tokyo (JP); Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 341 days.

(21) Appl. No.: 11/916,788

(22) PCT Filed: Jun. 26, 2006

(86) PCT No.: PCT/JP2006/312686
§ 371 (c)(1),
(2), (4) Date: Dec. 6, 2007

(87) PCT Pub. No.: WO2007/007532
PCT Pub. Date: Jan. 18, 2007

(65) Prior Publication Data
US 2009/0223638 A1    Sep. 10, 2009

(30) Foreign Application Priority Data

Jul. 7, 2005    (JP) ................................ 2005-198807

(51) Int. Cl.
*H01L 21/683*    (2006.01)
(52) U.S. Cl. ........................................ 156/522; 156/540
(58) Field of Classification Search .................. 156/522, 156/540
See application file for complete search history.

(56) References Cited

U.S. PATENT DOCUMENTS

| 7,060,154 B2 * | 6/2006 | Yamamoto et al. | 156/267 |
| 2003/0088959 A1 * | 5/2003 | Tsujimoto | 29/25.01 |
| 2006/0219359 A1 * | 10/2006 | Miyamoto et al. | 156/344 |

FOREIGN PATENT DOCUMENTS

| JP | 04293253 A | * | 10/1992 |
| JP | 06032522 A | * | 2/1994 |
| JP | 10-112494 A | | 4/1998 |
| JP | 2004-047976 A | | 2/2004 |
| JP | 2005-136306 A | | 5/2005 |

OTHER PUBLICATIONS

PCT/JP2006/312686—International Search Report, mailed Sep. 12, 2006.

* cited by examiner

*Primary Examiner* — Khanh Nguyen
*Assistant Examiner* — John Blades
(74) *Attorney, Agent, or Firm* — Lowe Hauptman Ham & Berner LLP

(57) ABSTRACT

A sheet sticking apparatus comprises a sheet feed-out unit 12 including a peel plate 22 for peeling off an adhesive sheet S from a release liner PS; and a press roller 14 for pressing the adhesive sheet S onto a wafer W supported by a table 13 to stick the sheet thereto, wherein the peel plate 22 is supported movably forward and backward by a cylinder 50. The peel plate 22 is arranged so that the initial position of the front end is adjusted forward/backward corresponding to the size of the wafer W or the size of the table 13 supporting the same.

11 Claims, 6 Drawing Sheets

SHEET STICKING APPARATUS

RELATED APPLICATIONS

The present application is based on, and claims priority from, International Application No. PCT/JP2006/312686 filed, Jun. 26, 2006, and Japan Application Number 2005-198807, filed Jul. 7, 2005, the disclosures of which are hereby incorporated by reference herein in its entirety.

FIELD OF THE INVENTION

The present invention relates to a sheet sticking apparatus, particularly to a sheet sticking apparatus capable of sticking a sheet to a plate-like object such as a semiconductor wafer while preventing waste of the sheet.

BACKGROUND OF THE ART

Conventionally, semiconductor wafers (hereinafter, simply referred to as "wafer") are stuck with a protective sheet for protecting circuit surface thereof, and stuck with an adhesive sheet for die bonding on the rear surface thereof.

As a sheet sticking apparatus described above, the following sticking apparatus is known. That is, using a raw strip sheet in which a strip of adhesive sheet is temporarily stuck on a strip of release liner, the adhesive sheet is peeled off from the release liner, stuck onto the wafer, and then cut off along the periphery of the wafer (refer to, for example, patent document 1).

Patent document 1: Japanese Patent Application Laid-Open No. 2004-47976

SUMMARY OF THE INVENTION

Problem to be Solved by the Invention

However, the sheet sticking apparatus disclosed in the patent document 1 adopts such arrangement that a set of guide rollers 28 for feeding out the sheet above the upper surface of the wafer, nips constantly the adhesive layer of the sheet while suspending the feeding operation; i.e., throughout from sticking operation, cutting operation and to peeling operation, and thereby, a line-like dent portion is formed in the width direction of the sheet. Therefore, in the case of the plate-like object like the wafer, which is subjected to a grinding process to obtain an extremely thin thickness of several tens of microns, a sheet with a trace of dent portion causes unevenness in thickness, or breakage of the wafer in the grinding processing. Thus, the area with the dent portion cannot be used for the area to be stuck to the wafer. The sheet, accordingly, can be fed so that the area with the dent portion is excluded. But, in that case, there arises such a disadvantage that the sheet is consumed wastefully.

Such disadvantage as described above can be solved by setting the guide rollers 28 at a position extremely close to the outer edge of the wafer. However, when the size of the table is changed corresponding to the size of the wafer, the above solution cannot cope with the problem, and thus, wasteful consumption of the sheet is inevitable.

Note that, the disadvantage due to the line-like dent trace occurs also in the case where a peel plate is used. That is, in the sheet peeled off from the release liner at the front edge position of the peel plate, the line-like dent trace is formed in the width direction in the sheet portion contacting with the front end of the peel plate while the feed-out operation is suspended, and the portion with the dent trace formed has to be excluded when the sheet is stuck to the wafer.

Object of the Invention

The present invention has been proposed in view of the above disadvantages. An object of the present invention is to provide a sheet sticking apparatus capable of sticking the sheet onto a plate-like object while minimizing the waste of the sheet to the utmost even when the dent trace on the sheet formed by the intermittent feed-out operation is removed so as not to be included in the sticking area.

Means for Solving Problems

In order to achieve the object, the present invention adopts such an arrangement that a sheet sticking apparatus, comprising: a sheet feed-out unit including a peel plate for peeling off a sheet from a release liner; and a press roller for pressing the sheet onto a plate-like object supported by a table to stick the sheet thereto, wherein the peel plate is supported movably forward and backward.

In the present invention such an arrangement is adopted that the peel plate moves toward the table, when the press roller moves from one end of the plate-like object toward the other end of the same.

Also, the following arrangement is preferably adopted; i.e., the peel plate moves in a state that a sheet-sticking angle is maintained at a constant angle.

Effect of the Invention

According to the present invention, since the peel plate is supported movably forward and backward, the front edge position of the peel plate can be moved forward or backward corresponding to the size of the plate-like object or the size of the table, thereby the position of the dent trace remaining portion can be adjusted. Therefore, feeding out operation of the sheet can be carried out so that the margin between the sheet areas to be stuck on respective plate-like objects is set to a short length, and the dent trace is positioned within the margin, and thus wasteful consumption of the sheet can be eliminated.

Also, such an arrangement is adopted that the peel plate moves toward the table as the sheet sticking is progressed. Accordingly if the position setting is arranged so that the front end of the peel plate coincides substantially with the outer edge of the table in a state that the sticking of the sheet has completed, the sheet can be fed out with minimum waste.

Further, since the peel plate moves in a state that the sticking angle of the sheet is constantly maintained, the tension of the sheet can be maintained at a constant, and thus the sheet can be stuck precisely.

EXPLANATION OF REFERENCE NUMERALS

10: sheet sticking apparatus
12: sheet feed-out unit
14: press roller
22: peel plate
50: cylinder
PS: release liner
S: adhesive sheet
W: wafer (plate-like object)
θ: sticking angle

DESCRIPTION OF THE PREFERRED EMBODIMENTS

Hereinafter, embodiments of the invention will be described with reference to the drawings.

Figure 1:
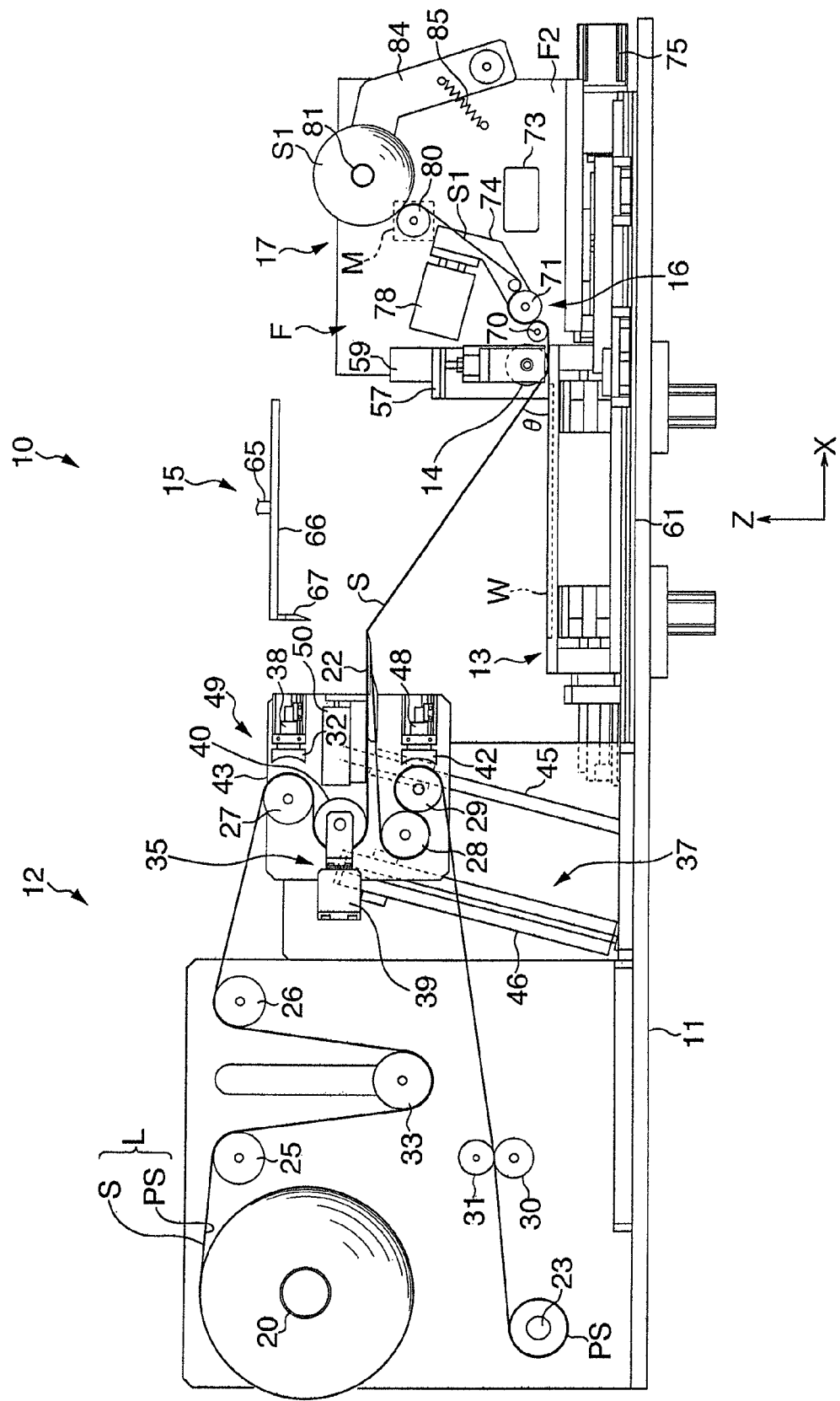
FIG. 1 is a front view schematically showing a sheet sticking apparatus in accordance with the embodiment.
Figure 2:
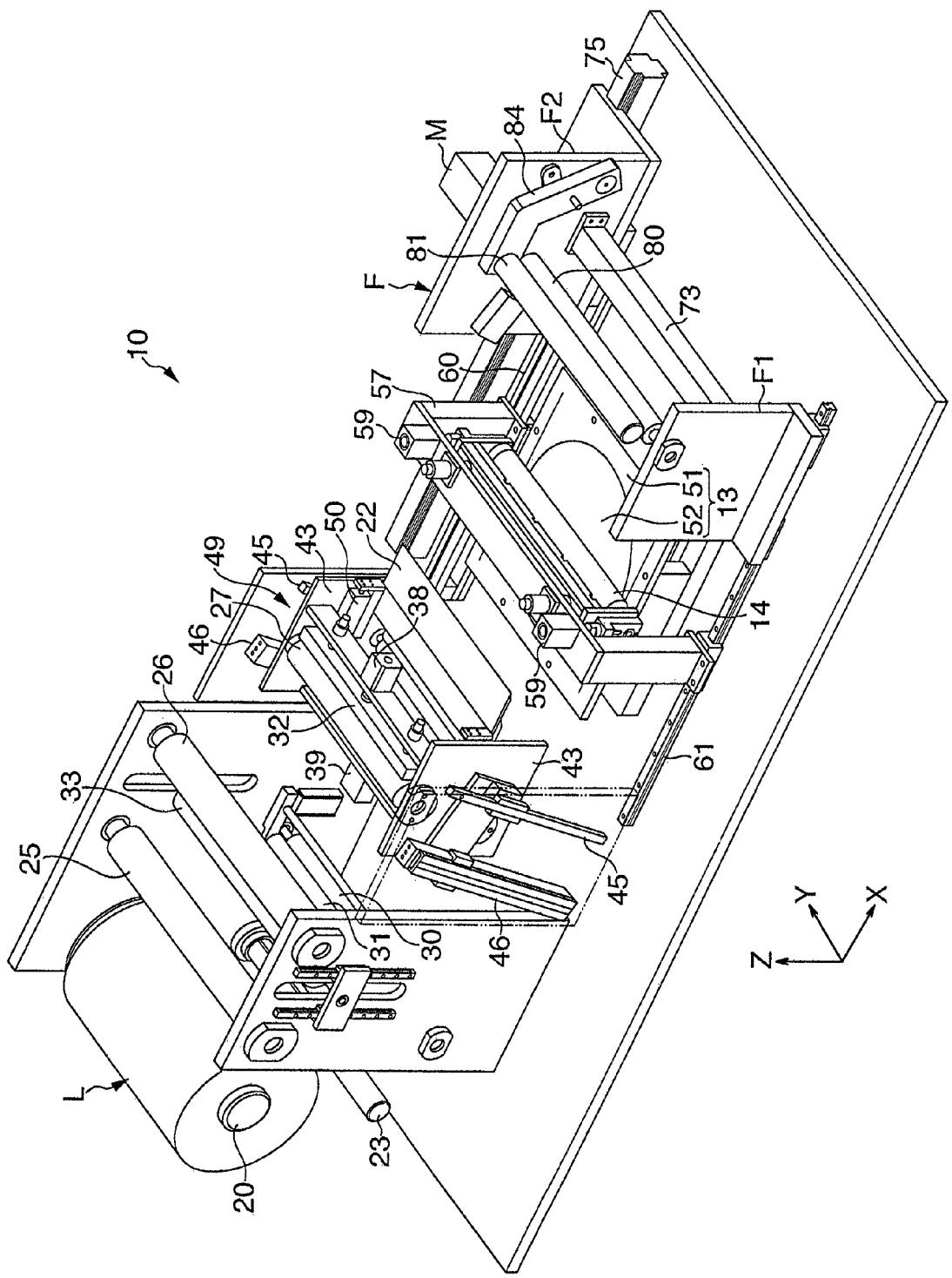
FIG. 2 is a perspective view schematically showing the sheet sticking apparatus.

FIG. 1 is a front view schematically showing a sheet sticking apparatus according to the embodiment; and FIG. 2 is a schematic perspective view thereof. In these figures, a sheet sticking apparatus 10 comprises: a sheet feed-out unit 12 disposed in the upper portion of a base 11; a table 13 for supporting a wafer W as a plate-like object; a press roller 14 for imparting a press force to an adhesive sheet S fed out to the upper surface side of the wafer W to stick the adhesive sheet S to the wafer W; a cutter 15 for cutting the adhesive sheet S along the outer periphery of the wafer W after sticking the adhesive sheet S to the wafer W; a peeling apparatus 16 for peeling off unnecessary adhesive sheet S1 outside the wafer W from the upper surface of the table 13; and a winding apparatus 17 for winding the unnecessary adhesive sheet S1.

The sheet feed-out unit 12 comprises: a support roller 20 for supporting a rolled raw strip sheet L in which the strip of adhesive sheet S is temporarily stuck on one surface of a strip of a release liner PS; a peel plate 22 with which the raw strip sheet L fed out from the support roller 20 is sharply folded back to peel off the adhesive sheet S from the release liner PS; a collection roller 23 for collecting the release liner PS by winding the same; a plurality of guide rollers 25 to 31 disposed between the support roller 20 and the collection roller 23; a buffer roller 33 disposed between the guide rollers 25 and 26; a tension measuring means 35 disposed between the guide rollers 27 and 28; and a sticking-angle maintaining means 37 for integrally supporting the peel plate 22, guide rollers 27, 28, 29 and the tension measuring means 35. Note that the guide rollers 27 and 29 are concomitantly provided with brake shoes 32 and 42 respectively. These brake shoes 32 and 42 are arranged so as, when sticking the adhesive sheet S to the wafer W, to be moved toward/away from the corresponding guide roller 27, 29 by means of cylinders 38 and 48 respectively, to nip the adhesive sheet S to restrain the feeding thereof.

The tension measuring means 35 comprises a load cell 39 and a tension measuring roller 40 supported by the load cell 39 and located at the base side of the peel plate 22. The tension measuring roller 40 is pulled by a tension of the adhesive sheet S, which is nipped by the guide roller 27 and the brake shoe 32 and is fed out to the press roller 14, and the tension is transmitted to the load cell 39. And, there is such an arrangement that while the load cell 39 measures the tension of the adhesive sheet S fed out, a feed-out head 49, which will be described later, moves downward at an angle in FIG. 1 via the sticking-angle maintaining means 37 so that the tension of the adhesive sheet S is maintained at a constant level.

The sticking-angle maintaining means 37 is arranged to interact with the press roller 14 so as to maintain the sticking angle θ of the adhesive sheet S with respect to the wafer W to a constant angle. The sticking-angle maintaining means 37 comprises: a feed-out head 49, including guide rollers 27, 28 and 29, the load cell 39, the tension measuring roller 40, brake shoes 32 and 42, cylinders 38 and 48, the peel plate 22 and a pair of slide plates 43 and 43 for supporting above items; a pair of guide rails 45, 45 for vertically guiding the feed-out head 49; and a pair of uniaxial robots 46 and 46 for imparting a force to the feed-out head 49 to move in the vertical direction. The guide rails 45 and the uniaxial robots 46 are disposed in an inclined posture enabling to move the feed-out head 49 vertically along the inclined angle.

Note that the peel plate 22 is supported by a cylinder 50 disposed at the inner side of the slide plates 43 enabling to move forward and backward in the X-direction in FIG. 1. Owing to this, the front edge position of the peel plate 22 can be adjusted in accordance with the diameter of the wafer W.

Figure 3:
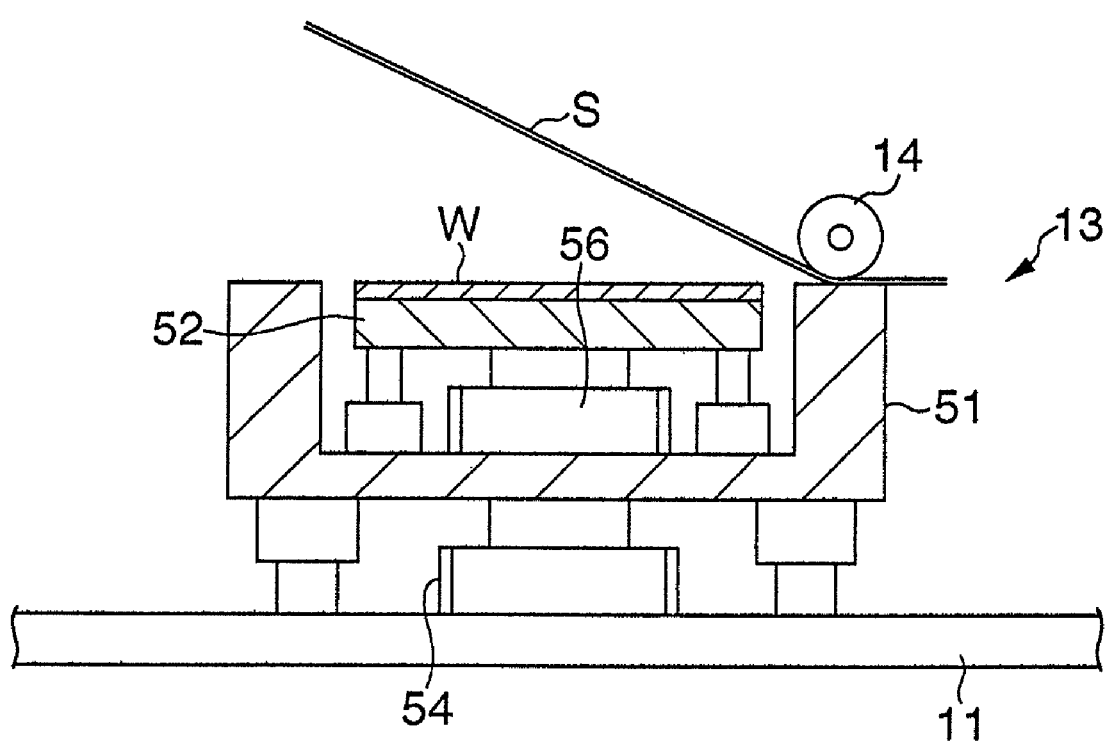
FIG. 3 is a cross sectional view schematically showing a table.

As shown in FIG. 3, the table 13 comprises: an outer table 51 having a substantially square shape in plane view; and an inner table 52 having a substantially circular shape in plane view. The outer table 51 is configured with a concave-shape so as to receive the inner table 52, and is arranged so as to move in the vertical direction with respect to the base 11 via a uniaxial robot 54. On the other hand, the inner table 52 is arranged so as to move in the vertical direction with respect to the outer table 51 via a uniaxial robot 56. Accordingly, the outer table 51 and the inner table 52 are arranged so as to move integrally in the vertical direction as well as to move in the vertical direction independently each other. Owing to this, the outer table 51 and the inner table 52 are arranged to be adjustable to a predetermined level position corresponding to the thicknesses of the adhesive sheet S and the wafer W.

The press roller 14 is supported via a portal frame 57. On the upper face side of the portal frame 57, cylinders 59, 59 are provided. The press roller 14 is arranged so as to move in the vertical direction owing to the operation of these cylinders 59. Incidentally, as shown in FIG. 2, the portal frame 57 is arranged to be movable in the X-direction in FIG. 1 via the uniaxial robot 60 and the guide rail 61.

The cutter 15 is provided movably in the vertical direction via a lifter (not shown) above the table 13. The cutter 15 comprises: a rotation arm 66 fixed to a rotation center shaft 65, and a cutter blade 67 supported by the rotation arm 66. When the cutter blade 67 is rotated around the rotation center shaft 65, the adhesive sheet S can be cut along the outer periphery of the wafer W.

As shown in FIGS. 1, 4 and 5, the peeling apparatus 16 comprises a small diameter roller 70 and a large diameter roller 71. A moving frame F supports the small diameter roller 70 and the large diameter roller 71. The moving frame F comprises a front frame F1 and a rear frame F2, which are opposing to each other in the Y-direction in FIG. 2, the rear frame F2 being connected to the front frame F1 via a connecting member 73. The rear frame F2 is supported by a uniaxial robot 75, while the front frame F1 is supported by the guide rail 61. Owing to this, the movable frame F is movable in the X-direction in FIG. 2. An arm member 74 supports the large diameter roller 71 as shown in FIG. 1. The arm member 74 is arranged so that a cylinder 78 can move the large diameter roller 71 in the direction closer to/away from the small diameter roller 70.

The winding apparatus 17 comprises: a drive roller 80 supported by the moving frame F; and a winding roller 81, which is supported at the free-end of the rotation arm 84 being abutted on the circumferential surface of the drive roller 80 via a spring 85 to nip the unnecessary adhesive sheet S1. A drive motor M is disposed at the shaft end of the drive roller 80, and it is arranged so that, when the drive roller 80 is driven to rotate by the motor M, the winding roller 81 follows the drive roller 80 to rotate; thereby the unnecessary adhesive sheet S1 is wound thereon. Note that as the wound amount increases, the winding roller 81 shifts rightward in FIG. 1 against the force of the spring 85.

Next, the sticking method of the adhesive sheet S in accordance with the embodiment will be described with reference to FIGS. 4 and 5 as well.

In the initial setting, in the raw strip sheet L, which is fed out from the support roller 20, the adhesive sheet S is peeled off from the release liner PS at the front edge position of the peel plate 22, and the lead end of the release liner PS is fixed to the collection roller 23 through the guide rollers 28, 29. On the other hand, the lead end of the adhesive sheet S is fixed to the winding roller 81 of the winding apparatus 17 through the press roller 14 and the peeling apparatus 16. Here, the peel plate 22 constituting the front end of the feed-out head 49 is positioned at its upper limit position (refer to FIG. 1 and FIG. 4(A)). And the adhesive sheet S between the peel plate 22 and the press roller 14 is set so as to have a predetermined sticking angle θ with respect to the surface of the wafer W disposed on the table 13 as shown in FIG. 1. Also, the position of the front end of the peel plate 22 is adjusted by the cylinder 50 so that the length of the adhesive sheet S between the peel plate 22 and the press roller 14 is a little longer than the length from the one end to the other end, i.e., from the right end to the left end of the wafer W in FIG. 4.

In a state that the wafer W is set on the table 13 by means of a transfer arm (not shown), the sticking operation starts. Before sticking operation starts, the brake shoes 32, 42 are brought into contact with the guide rollers 27, 29 to restrain the adhesive sheet S from being fed out. In a state that the table 13 is at a standstill, the press roller 14 rotates and moves on the wafer W leftward in FIG. 4. When the press roller moves, a tension is applied to the adhesive sheet S, and the tension measuring roller 40 is pulled in the X-direction. Then, the load cell 39 measures the tension, and thereby the feed-out head 49 is lowered at an angle by using the sticking-angle maintaining means 37 to maintain a predetermined tension. That is, the load cell 39 measures the tension, and is controlled to output an instruction to the pair of uniaxial robots 46 to maintain the predetermined tension based on the data.

Therefore, as a result, the feed-out head 49 gradually descends along the inclined angle of the guides 45 and uniaxial robots 46 (refer to FIG. 1). Owing to this, even when the length of the adhesive sheet S between the front end of the peel plate 22 and the press roller 14 becomes shorter, the sticking angle θ is maintained constantly to a constant angle.

Figure 4A:
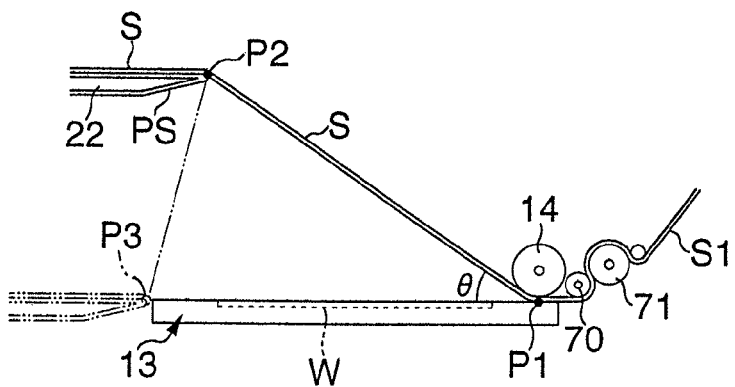
FIGS. 4(A) to 4(E) are explanatory views showing sticking operation of adhesive sheet.
Figure 4B:
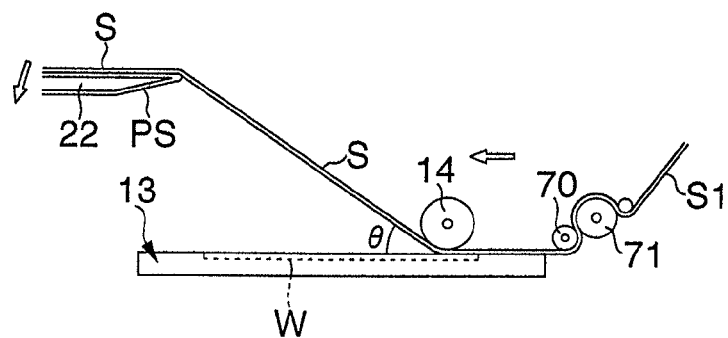
Figure 4C:
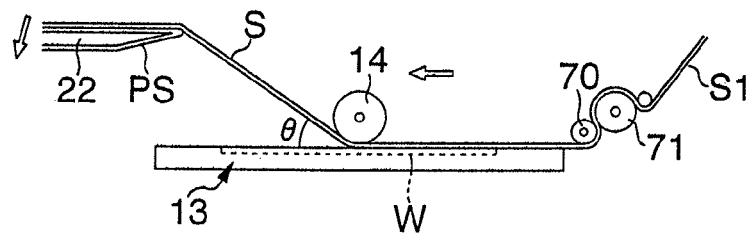

In this embodiment, as described above, during the sticking operation of the press roller 14, the feed-out head 49 is lowered while the tension of the adhesive sheet S being measured with the load cell 39. As a result, the sticking angle θ is maintained. However, control of descent of the feed-out head 49 may eliminate the load cell 39. That is, as shown in FIG. 4(A), assuming that the lowermost position of the press roller 14 and the front edge position of the peel plate 22 at the start point of the sticking operation be P1 and P2 respectively; the front edge position of the peel plate 22 at the point when the sticking operation of the adhesive sheet S has been completed be P3; and the sticking angle formed by P2, P1 and P3 be θ, the following arrangement may also be adopted. That is, the uniaxial robots 46 and 60 are controlled synchronously to lower the feed-out head 49 constituting the sticking-angle maintaining means 37 along the guide bars 45 so that, as the press roller 14 moves and the distance between the points P1 and P3 is made smaller by the uniaxial robot 60, the level of the peel plate 22, that is the distance between the points P2 and P3 also becomes shorter, and thus the sticking angle θ is constantly maintained. Note that the movement amount of the feed-out head 49 is readily calculated by using the trigonometric function. Thus by constantly maintaining the sticking angle θ based on the detection of the movement distance of the press roller 14, the same operation and effect as those of the tension control using the load cell 39 can be obtained. In the present invention, these control methods can be employed selectively.

Figure 4D:
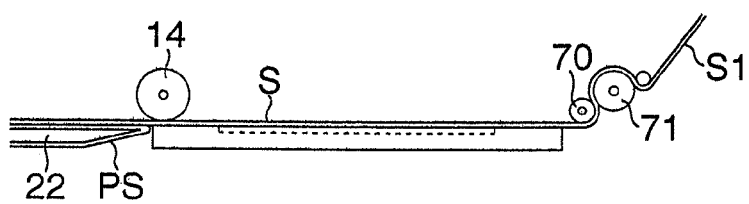
Figure 4E:
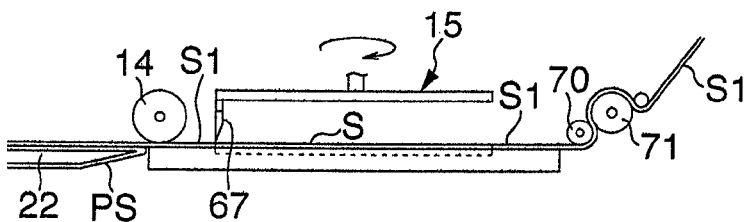
Figure 5A:
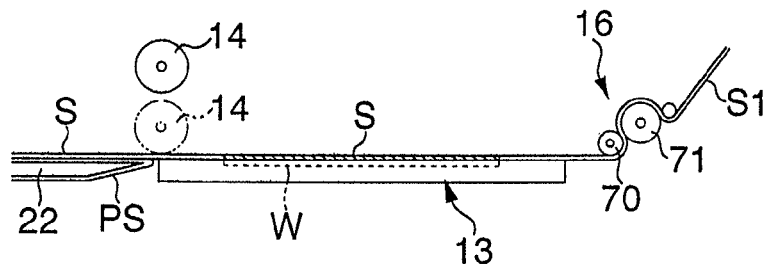
FIGS. 5(A) to 5(D) are explanatory views showing peeling operation of unnecessary adhesive sheet by a peeling apparatus.
Figure 5B:
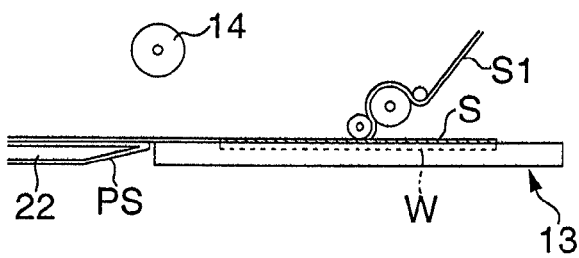
Figure 5C:
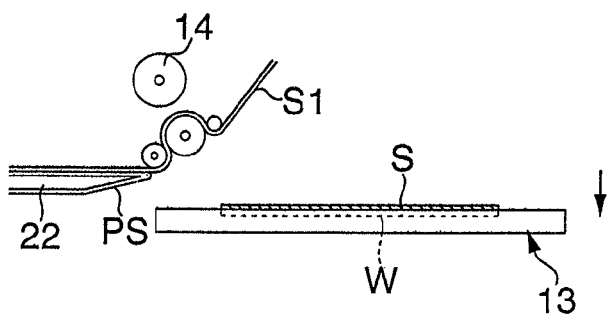
Figure 5D:
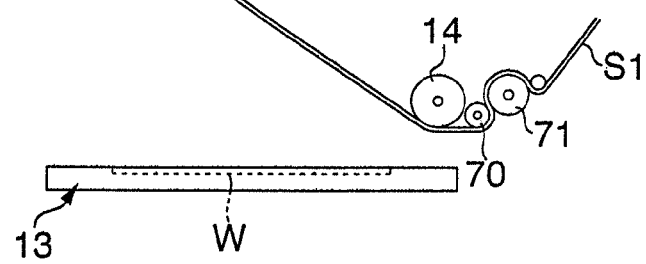

As shown in FIGS. 4(D) and 4(E), when the sticking operation of the adhesive sheet S has been completed, the cutter 15 descends to cut the adhesive sheet S along the peripheral edge of the wafer W, and then the cutter 15 goes up to return to the initial position (refer to FIG. 1). At this time, the front end of the peel plate 22 is positioned in the vicinity of the left end of the wafer W. Owing to this, the area of the adhesive sheet existing at the left side from the front edge position of the peel plate 22 can be used as the area to be stuck to the next wafer W, thus the adhesive sheet S is prevented from being consumed wastefully.

Then, after the wafer W is removed from the table 13 by means of a transfer apparatus, as shown in FIGS. 5(A) to 5(D), the press roller 14 goes up, and the small diameter roller 70 and the large diameter roller 71 constituting the peeling apparatus 16 move leftward. And the drive roller 80 of the winding apparatus 17 is driven to wind the unnecessary adhesive sheet S1; thus the unnecessary adhesive sheet S1 around the wafer W can be peeled off from the upper surface of the table 13.

Then, the brake shoes 32, 42 move away from the guide rollers 27, 29 so that the raw strip sheet L can be fed out, and in a state that the drive roller 80 is locked, the peeling apparatus 16 and the winding apparatus 17 return to the initial position. As a result, new adhesive sheet S is pulled out and new wafer W is transferred onto the table 13 again.

Figure 6A:
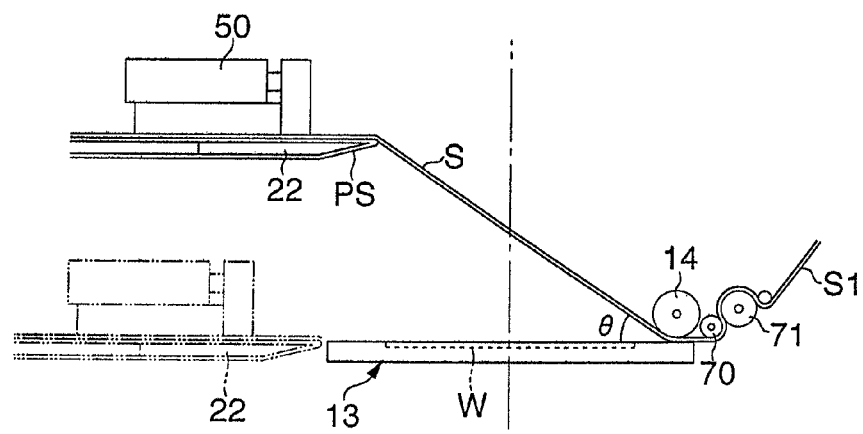
FIGS. 6(A) and 6(B) are explanatory views showing initial position of a press roll and a peel plate when the table is changed.
Figure 6B:
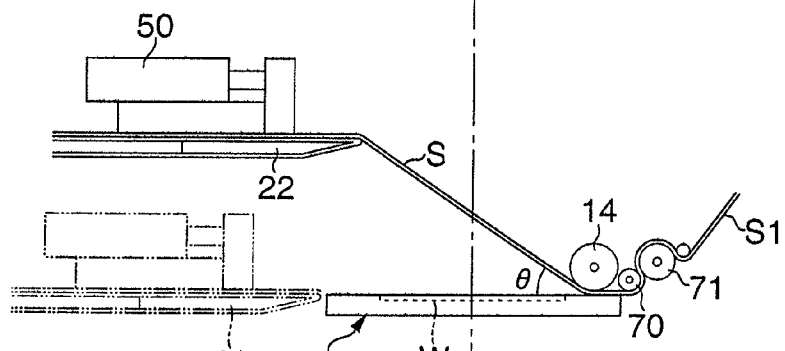

When the size of the wafer W as the object to be stuck is changed; for example, from the size shown in FIG. 6(A) to a size shown in FIG. 6(B), a table 13 of which plane area is relatively small is employed. In this case, the initial position of the press roller 14 is set being shifted leftward, and the initial position of the peel plate 22 is set at a position closer to the table 13 being shifted rightward by the cylinder 50. Owing to this arrangement, the sticking angle θ is maintained.

Accordingly, even when the small table 13 is employed, by setting the initial position of the peel plate 22 in advanced position, the front end of the peel plate 22 at a point that the sticking of the adhesive sheet S is completed can be kept at a substantially contacting position with the outer edge of the table 13. Accordingly, the left side sheet area from the front edge position of the peel plate 22 can be used as the area to be stuck to the next wafer. Therefore, it is possible to stick the adhesive sheet S without waste through preventing the dent trace, which is formed by the front end of the peel plate 22, from being included in the area to be stuck to the wafer.

The best arrangement, method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to the shape, position and/or disposition without departing from the technical spirit and the range of the object of the present invention.

For example, in the above-described embodiment, an example in which the plate-like object is the wafer has been described. However, the present invention is applicable to such an arrangement that a sheet or film is stuck on a plate-like object other than wafer.

Also, in the embodiment, an exchange method was shown between two kinds of wafer sizes using a cylinder 50 for adjusting the front edge position of the peel plate 22. However, in place of the above, when a uniaxial robot capable of positional controlling is used, various sizes of the wafer can be handled.

The invention claimed is:

1. A sheet sticking apparatus, comprising: a sheet feed-out unit including a peel plate for peeling off a sheet from a release liner that is stuck to the sheet temporarily; a table for supporting a plate-shaped object; and a press roller for pressing and sticking the sheet onto the plate-shaped object on the table, wherein the peel plate is moveable forward or backward in correspondence to a size of the plate-shaped object or a size of the table and has a front end where the sheet is peelable off from the release liner, wherein, in a state that the sticking of the sheet is completed, the front end of the peel plate is positioned in a vicinity of an end of the plate-shaped object or substantially coinciding with an outer edge of the table, and wherein the peel plate moves downward when said press roller horizontally moves from a first end of the table toward a second end opposite to the first end.

2. The sheet sticking apparatus according to claim 1, wherein said peel plate moves toward said table when said press roller moves from the first end of the table toward the second end of the table.

3. The sheet sticking apparatus according to claim 2, further comprising means for maintaining a sheet-sticking angle of the sheet with respect to the plate-shaped object at a constant angle during the sticking of the sheet.

4. The sheet sticking apparatus according to claim 1, wherein, in a state that the sticking of the sheet is completed, the peel plate and the table are positioned substantially in a same plane.

5. The sheet sticking apparatus according to claim 1, wherein, in a state that the sticking of the sheet is completed, the front end of the peel plate is positioned at the second end of the table and along the outer edge of the table.

6. The sheet sticking apparatus according to claim 2, further comprising a cutter for cutting the sheet along a peripheral edge of the plate-shaped object in the state that the sticking of the sheet is completed.

7. The sheet sticking apparatus according to claim 1, wherein, in the state that the sticking of the sheet is completed, the front end of the peel plate coincides substantially with the outer edge of the table at the second end of the table therefore the sheet is fed out with minimum waste.

8. The sheet sticking apparatus according to claim 1, wherein the table comprises an inner table; and an outer table configured with a concave shape and receiving the inner table, and wherein the outer table and the inner table are moveable integrally in a vertical direction as well as independently with each other in the vertical direction corresponding to a thickness of the sheet and a thickness of the plate-shaped object.

9. The sheet sticking apparatus according to claim 1, further comprising:

a peeling apparatus for peeling off an unnecessary sheet outside the plate like plate-shaped object from an upper surface of the table; and a winding apparatus for winding the unnecessary sheet.

10. The sheet sticking apparatus according to claim 9, wherein the press roller is moveable in a vertical direction, after the state that the sticking of the sheet is completed, the press roller is moved upward in the vertical direction.

11. The sheet sticking apparatus according to claim 10, wherein the peeling apparatus comprises a small diameter roller and a large diameter roller engaged with the small diameter roller, and a drive roller, upon moving the press roller upward, the small and large diameter rollers driven by the drive roller are moveable forward the second end of the table, and the unnecessary sheet is peeled off from the upper surface of the table.

* * * * *